United States Patent [19]

Schiel

[11] 3,889,284

[45] June 10, 1975

[54] AVALANCHE PHOTODIODE WITH VARYING BANDGAP

[75] Inventor: Ernst J. Schiel, Ocean, N.J.

[73] Assignee: The United States of America as represented by the Secretary of the Army, Washington, D.C.

[22] Filed: Jan. 15, 1974

[21] Appl. No.: 433,585

[52] U.S. Cl. ........................ 357/30; 357/16; 357/61; 357/13

[51] Int. Cl. ............................................ H01l 15/00

[58] Field of Search ..... 317/235 AC, 235 N, 235 T, 317/235 AM; 357/30, 16, 61, 13

[56] References Cited

UNITED STATES PATENTS

| | | | |
|---|---|---|---|
| 3,675,026 | 7/1972 | Woodall | 250/211 J |
| 3,814,993 | 6/1974 | Kennedy | 357/30 |
| 3,821,777 | 6/1974 | James | 317/235 |

*Primary Examiner*—Martin H. Edlow
*Attorney, Agent, or Firm*—Nathan Edelberg; Robert P. Gibson; Roy E. Gordon

[57] ABSTRACT

A photodetector for radiation in the 1.0 to 2.5 micrometer region is provided; the photodetector comprising a hybrid material photodiode including a photon absorption material and an avalanche multiplying junction.

7 Claims, 3 Drawing Figures

AVALANCHE PHOTODIODE WITH VARYING BANDGAP

This invention relates in general to photodetectors, and in particular to photodetectors for radiation in the 1.0 to 2.5 micrometer region.

BACKGROUND OF THE INVENTION

For the detection of laser radiation in the 1.0 to 2.5 micrometer region, a fast detector in the nanosecond region is required. Such a detector receives Q-switched laser pulses from rangefinders, target designators, and illumination and wide bandwidth communication equipment. Lasers capable of emitting such pulses include neodymium doped glass and neodymium doped yttrium aluminum garnet which emit pulses at 1.06 micrometers. Other lasers such as erbium doped glass and erbium doped yttrium aluminum garnet emit pulses at 1.54 and 1.66 micrometers respectively. Then, holmium doped (YLF) and holmium doped yttrium aluminum garnet emit pulses at about 2.1 micrometers.

Heretofore, silicon and germanium avalanche detectors have been developed which have shown superior performance to other detectors such as photocathodes, "non" avalanche silicon and germanium detectors. The silicon and germanium avalanche detectors are also superior to the III-V photocathodes under background (daylight) limited conditions. The superior performance of these silicon and germanium avalanche detectors is based on high quantum efficiency and high avalanche gain of photo generated carriers. The gain, several hundred times, increases the number of carriers and increases overall sensitivity and signal to noise ratio. The dominating noise is usually amplifier noise that is, noise from the amplifier following the detector. In the case of "wide field of view" detectors, photon shot noise is caused by background radiation.

Avalanche photodiodes or infrared diodes have also been fabricated in III-V materials such as gallium arsenide, indium arsenide and indium antimonide. Excellent results have been achieved in gallium arsenide, but the high bandgap makes this material unsuitable for the laser reception mentioned before. Indium arsenide and indium antimonide are low bandgap materials, but diodes fabricated from these materials have a high dark current and must be cooled to about 77° Kelvin for noiseless operation. The difficulty with the silicon avalanche detector is that the absorption length is large for 1.06 micrometer radiation such as is emitted by neodymium lasers. Similarly, the difficulty with the germanium avalanche detector is that the absorption length is large for 1.5 micrometer radiation such as is emitted by erbium lasers. Therefore, devices with high quantum efficiencies require large depletion layer width, which are relatively difficult to fabricate and limited in time response. In fact, no really good detector with gain and fast response operating at room temperature exists for 2.0 micrometer radiation.

Ideally, photodiodes should be made from a material that has a bandgap just below the photon energy of the wave length to be detected. Ternary III-V compounds such as GaInAs, and InAsP; and II-VI compounds such as HgCdTe offer the possibility of adjusting the bandgap to the desired wavelength range by adjusting the composition of the material. Some attempts in this direction have been made and were fairly successful, but devices with avalanche gain have not been produced. In these materials, a rather large lattice mismatch exists between the basic constituents GaAs-InAs which causes lattice defects. On the site of lattice defects, microplasmas are formed in the field region of the junction which cause low breakdown voltage and prevent any significant avalanche gain.

SUMMARY OF THE INVENTION

The general object of this invention is to provide a photodetector for radiation in the 1.0 to 2.5 micrometer region. A more specific object of the invention is to provide such a photodetector that will be characterized by high avalanche gain and fast response when operating at room temperature.

According to this invention, a photodetector that meets the foregoing objectives is provided including two regions of different semiconductor materials; a wit, an absorber and an avalanche multiplication region.

There are numerous combinations of variable bandgap III-V alloys such as GaInAs and InAsP that can be used as the photon absorption material. Combinations of variable bandgap II-VI alloys such as HgCdTe can also be used as the photon absorption material. As the avalanche material, compounds such as GaAs, InAs, or InSb may be used.

DESCRIPTION OF THE DRAWING

In FIG. 1 of the drawing, the $n^+p$ junction in GaAs is, in reverse bias, the "multiplier" 10; the GaInAs layer the "absorber" 12. A passivation layer 16 is deposited on the multiplier surface, 10 to prevent surface breakdown. The GaInAs layer 12 is comprised of a continuously varying bandgap GaInAs layer starting with 100 percent GaAs on the left side of the drawing and changing to higher InAs values on the right through which the electric field reaches through to the back contact, 14. These can be any desired GaAs—InAs composition, dependent on the wavelength to be detected as can be seen from the following TABLE.

TABLE

| | | | |
|---|---|---|---|
| WAVELENGTH TO BE DETECTED (Micrometers) | 1.06 | 1.54 | 2.1 |
| BANDGAP (Electronvolts) | 1.2 | 0.85 | .06 |
| MOLE PERCENT InAs | 15 | 35 | 65 |
| MOLE PERCENT GaAs | 85 | 65 | 35 |

Figure 1:
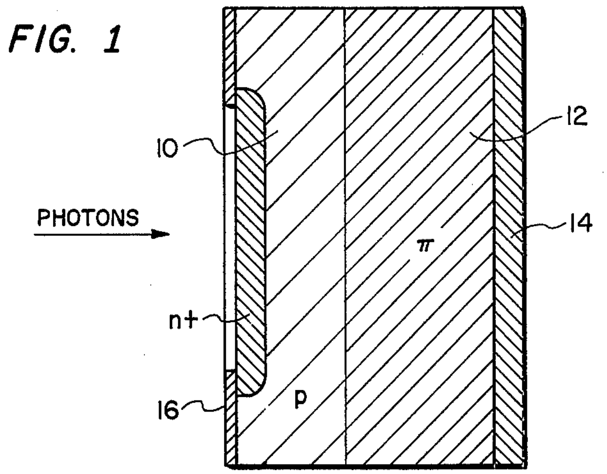
FIG. 1 is a cross sectional view of a photodetector according to the invention.
Figure 2:
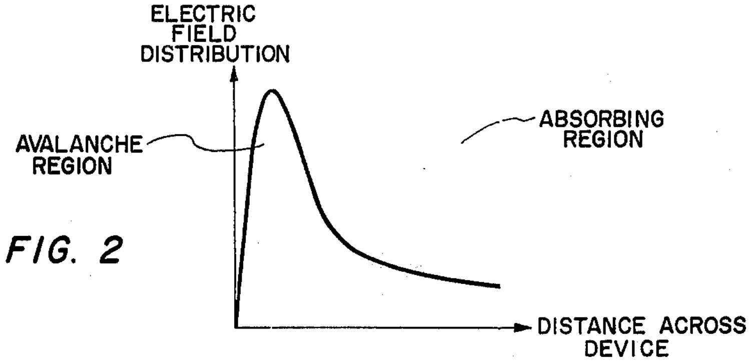
FIG. 2 is a graph indicating the electric field distribution in the photodetector.
Figure 3:
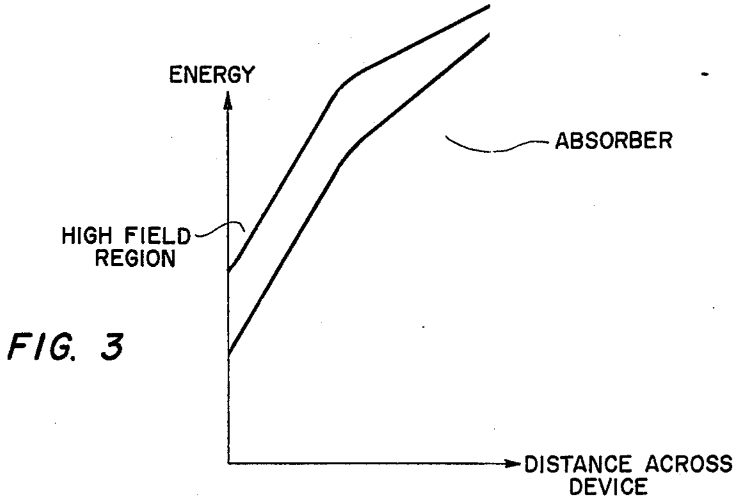
FIG. 3 is a graph of the bandgap distribution of the photodetector.

As can be seen from the TABLE, the longer the wavelength to be detected, the more InAs has to be added to lower the bandgap. Thus, the doping concentration of the layers has to be tailored so that an electric field distribution as shown in FIG. 2 exists such that a high field region is present in the multiplying junction. A lower field is present in the absorber, the field in the absorber being sufficient to move the photogenerated carriers toward the multiplying junction.

The embodiment shown in the drawing ($n^+p$ — GaAs $\pi$GaInAs) is the preferred photoconductor structure because the mobility of electrons is much higher (several 10,000cm$^2$/volt sec) than for holes (less than 1,000cm$^2$/volt sec). Moreover, the ionization coefficient, which determines the avalanche gain is higher for electrons than for holes. It is also possible to make a $p^+nv$ structure which would not be as efficient. Time response of such a diode can be made extremely fast when layers in the order of microns are made, for example, the transistion time through a 5 micrometer absorber with a mobility of 20,000cm²/volt second and an electric field of 100 volt/cm would be $$t = \frac{d}{\mu E} = \frac{5 \times 10^{-4}}{20,000 \times 100} = 1.25 \times 10^{-10} \text{ sec}$$

This would not limit the time response of the diode, but the RC time constant will effectively limit the time response.

Dark current in this structure is also kept to the very minimum, because only the absorber, or low bandgap parts of the absorber, give rise to higher intrinsic carrier density. The higher (GaAs) bandgap part of the device does not contribute to any significant extent to the dark current. This feature is very important for the room temperature operation of the device.

The photodetector shown in the drawing can be conveniently made as follows.

Starting with a substrate of $n^+$ GaAs material (silicon doped) a p-GaAs layer can be formed either by zinc-diffusion or formation of a Zn doped layer by epitaxial growth techniques, either liquid or vapor epitaxy. A passivation layer is then deposited on the surface. Then the GaInAs is formed by vapor epitaxy using a Gallium and Indium source which have to be varied during growth to achieve a continuously varying bandgap. The aforementioned variation during growth is conveniently carried out by changing the gallium to indium source ratio. It is imperative that the zinc dopant does not diffuse during the formation of the absorber region. Fortunately, zinc diffuses in GaAs at 800° to 900° C and epitaxial growth temperatures are lower (600° to 750° C), so that this condition can be met.

"Guard rings" can be made in the conventional manner by diffusing a dopant or by proton bombardment. The guard ring has only to be made to the depth of the high field region in GaAs.

The aforedescribed photodetector has a "broadband" response in the optical sense because there is a part in the absorber with just the right bandgap and absorption length for a specfic wave length range. This feature is not important for laser detection, but very important for Gun-Flash detection.

I wish it to be understood that I do not desire to be limited to the exact details of construction shown and described, for obvious modifications will occur to a person skilled in the art.

What is claimed is:

1. A photodetector for radiation in the 1.0 to 2.5 micrometer region, said photodetector comprising a photodiode including two adjacent regions of two different semiconductor materials, one of said regions comprising a photon absorption material selected from the group consisting of GaInAs and InAsP and the other of said regions comprising a material selected from the group consisting of GaAs, InAs, and InSb and containing an n-p junction biased in the avalanche mode.

2. A photodetector according to claim 1 wherein the photon absorption material is GaInAs.

3. A photodetector according to claim 1 wherein the photon absorption material is InAsP.

4. A photodetector according to claim 1 wherein the material containing the n-p junction is in GaAs.

5. A photodetector according to claim 1 wherein the photon absorption material is GaInAs and wherein the material containing the n-p junction is GaAs.

6. A photodetector according to claim 1 wherein the containing the n-p junction material is InP.

7. A photodector according to claim 1 wherein the photon absorption material is InAsP and the material containing the n-p junction is InP.

* * * * *